United States Patent
Huang et al.

(10) Patent No.: US 10,923,317 B2
(45) Date of Patent: Feb. 16, 2021

(54) DETECTING DEFECTS IN A LOGIC REGION ON A WAFER

(71) Applicants: KLA Corporation, Milpitas, CA (US); Shan Zhu

(72) Inventors: Junqing Huang, Fremont, CA (US); Paul Russell, Brighton (GB); Hucheng Lee, Cupertino, CA (US); Kenong Wu, Davis, CA (US)

(73) Assignee: KLA Corp., Milpitas, CA (US)

( * ) Notice: Subject to any disclaimer, the term of this patent is extended or adjusted under 35 U.S.C. 154(b) by 0 days.

(21) Appl. No.: 16/543,596

(22) Filed: Aug. 18, 2019

(65) Prior Publication Data

US 2020/0090904 A1 Mar. 19, 2020

Related U.S. Application Data

(60) Provisional application No. 62/733,497, filed on Sep. 19, 2018.

(51) Int. Cl.
*H01J 37/28* (2006.01)
*G01N 21/95* (2006.01)
*H01J 37/244* (2006.01)

(52) U.S. Cl.
CPC .......... *H01J 37/28* (2013.01); *G01N 21/9501* (2013.01); *H01J 37/244* (2013.01); *G01N 2223/611* (2013.01)

(58) Field of Classification Search
None
See application file for complete search history.

(56) References Cited

U.S. PATENT DOCUMENTS

| 8,126,255 B2 | 2/2012 | Bhaskar et al. |
| 8,664,594 B1 | 4/2014 | Jiang et al. |
| 8,692,204 B2 | 4/2014 | Kojima et al. |
| 8,698,093 B1 | 4/2014 | Gubbens et al. |
| 8,716,662 B1 | 5/2014 | MacDonald et al. |

(Continued)

OTHER PUBLICATIONS

Tolle I, Jain A. Innovative scalable design based care area methodology for defect monitoring in production. In 2017 28th Annual SEMI Advanced Semiconductor Manufacturing Conference (ASMC) May 15, 2017 (pp. 144-148). IEEE. (Year: 2017).*

(Continued)

*Primary Examiner* — Vu Le
*Assistant Examiner* — Tracy Mangialaschi
(74) *Attorney, Agent, or Firm* — Ann Marie Mewherter

(57) ABSTRACT

Methods and systems for detecting defects in a logic region on a wafer are provided. One method includes acquiring information for different types of design-based care areas in a logic region of a wafer. The method also includes designating the different types of the design-based care areas as different types of sub-regions and, for a localized area within the logic region, assigning two or more instances of the sub-regions located in the localized area to a super-region. In addition, the method includes generating one scatter plot for all of the two or more instances of the sub-regions assigned to the super-region. The one scatter plot is generated with different segmentation values for the output corresponding to the different types of the sub-regions. The method further includes detecting defects in the sub-regions based on the one scatter plot.

21 Claims, 6 Drawing Sheets

(56) References Cited

U.S. PATENT DOCUMENTS

| | | |
|---|---|---|
| 9,222,895 B2 | 12/2015 | Duffy et al. |
| 2014/0301629 A1 | 10/2014 | Ramachandran |
| 2014/0376801 A1 | 12/2014 | Karsenti et al. |
| 2015/0012900 A1 | 1/2015 | Shifrin et al. |
| 2015/0043804 A1* | 2/2015 | Huang .................. G06T 7/90 382/149 |
| 2015/0254394 A1 | 9/2015 | Hu et al. |
| 2016/0116420 A1 | 4/2016 | Duffy et al. |
| 2017/0352145 A1* | 12/2017 | Dhagat .............. G02B 21/0016 |

OTHER PUBLICATIONS

International Search Report and Written Opinion for PCT/US2019/051610 dated Feb. 28, 2020.

* cited by examiner

DETECTING DEFECTS IN A LOGIC REGION ON A WAFER

BACKGROUND OF THE INVENTION

1. Field of the Invention

This invention generally relates to methods and systems for detecting defects in a logic region on a wafer. Certain embodiments relate to detecting defects in a logic region on a wafer by organizing sub-regions in the logic region into super-regions and collectively processing the sub-regions in a super-region for defect detection.

2. Description of the Related Art

The following description and examples are not admitted to be prior art by virtue of their inclusion in this section.

Inspection processes are used at various steps during a semiconductor manufacturing process to detect defects on wafers to promote higher yield in the manufacturing process and thus higher profits. Inspection has always been an important part of fabricating semiconductor devices such as ICs. However, as the dimensions of semiconductor devices decrease, inspection becomes even more important to the successful manufacture of acceptable semiconductor devices because smaller defects can cause the devices to fail. For instance, as the dimensions of semiconductor devices decrease, detection of defects of decreasing size has become necessary since even relatively small defects may cause unwanted aberrations in the semiconductor devices.

Many inspection methods and systems have been improved due to the creation and implementation of design based care areas. For example, images generated by inspection systems and methods can be separated based on the different design portions that they correspond to by correlating design information for wafers to the images. Different detection parameters can then be applied to the different, separated portions of the images. The different detection parameters can be determined based on the differences in the importance of the different design portions. For example, more critical portions of the design can be inspected with higher sensitivity while less critical portions of the design can be inspected with lower sensitivity. In addition, the different detection parameters can be determined based on the noise characteristics that the different design portions produce in the inspection images. In one such example, design portions that generate more noise in the inspection images can be inspected with less sensitivity while design portions that generate less noise in the inspection images can be inspected with higher sensitivity.

Design based care areas have therefore allowed for more appropriate defect detection to be performed in different areas of the design. Tailoring the defect detection in this manner can improve the usefulness of the inspection results since the inspection results may include more defects of interest (DOIs) and fewer nuisance or noise detections. In addition, the defect detection results are more useful for improving the fabrication process since they include more design-relevant defects. Such inspection results can also be more useful for monitoring and improving the fabrication process because the inspection results will include fewer noise or nuisance events that are not relevant to the successful production of semiconductor devices.

Improvements in the ability to align inspection images to design information have also allowed the reduction in the size of design based care areas, which allows the inspection process to be varied at a higher frequency across the wafer (e.g., from pixel-to-pixel in the most extreme case). Obviously, however, a significant increase in the number of different care areas (design based or otherwise) can have a significant adverse impact on the inspection process as well. For example, the number of care areas can become so high that the inspection process becomes impractical from a throughput or cost perspective. As a result, some inspection processes have to be performed with less optimal parameters and therefore lower performance than the inspection tool is capable of in order to make the inspection processes practical for throughput and cost perspectives.

Accordingly, it would be advantageous to develop methods and systems for detecting defects in a logic region on a wafer that do not have one or more of the disadvantages described above.

SUMMARY OF THE INVENTION

The following description of various embodiments is not to be construed in any way as limiting the subject matter of the appended claims.

One embodiment relates to a system configured to detect defects on a wafer. The system includes an inspection subsystem configured to scan a wafer to thereby generate output for the wafer. The system also includes a computer subsystem configured for acquiring information for design-based care areas in a logic region of the wafer. The design-based care areas include different types of design-based care areas and each of the design-based care areas is a discrete area within the logic region corresponding to a contiguous set of pixels in the output generated for the wafer. The computer subsystem is also configured for designating the different types of the design-based care areas as different types of sub-regions. For a localized area within the logic region, the method includes assigning two or more instances of the sub-regions located in the localized area to a super-region. In addition, the computer subsystem is configured for generating one scatter plot for all of the two or more instances of the sub-regions assigned to the super-region. The one scatter plot is generated with different segmentation values determined for the output corresponding to the different types of the sub-regions. The computer subsystem is further configured for detecting defects in the sub-regions based on the one scatter plot. The system may be further configured as described herein.

Another embodiment relates to a computer-implemented method for detecting defects in a logic region on a wafer. The method includes the acquiring, designating, assigning, generating, and detecting steps described above. Each of the steps of the method may be performed as described further herein. The method may include any other step(s) of any other method(s) described herein. The method may be performed using any of the systems described herein.

Another embodiment relates to a non-transitory computer-readable medium storing program instructions executable on a computer system for performing a method for detecting defects in a logic region on a wafer. The method includes the steps of the computer-implemented method described above, which may be performed as described further herein. In addition, the method for which the program instructions are executable may include any other step(s) of any other method(s) described herein. The non-transitory computer-readable medium may be further configured as described herein.

BRIEF DESCRIPTION OF THE DRAWINGS

Other objects and advantages of the invention will become apparent upon reading the following detailed description and upon reference to the accompanying drawings in which.

Figure 1:
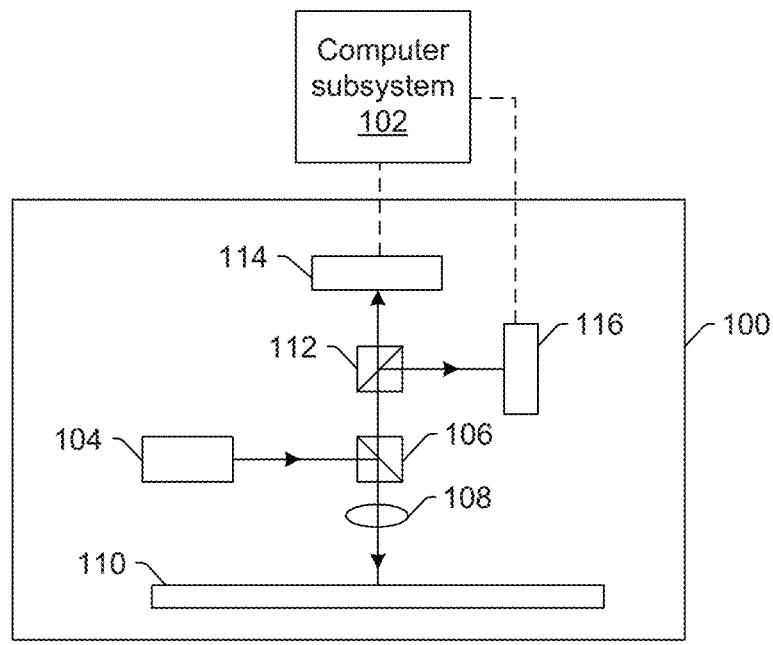
FIGS. 1-2 are schematic diagrams illustrating a side view of embodiments of a system configured to detect defects in a logic region on a wafer.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE PREFERRED EMBODIMENTS

Turning now to the drawings, it is noted that the figures are not drawn to scale. In particular, the scale of some of the elements of the figures is greatly exaggerated to emphasize characteristics of the elements. It is also noted that the figures are not drawn to the same scale. Elements shown in more than one figure that may be similarly configured have been indicated using the same reference numerals. Unless otherwise noted herein, any of the elements described and shown may include any suitable commercially available elements.

The embodiments described herein generally relate to super-regions for segmentation type defect detection algorithms such as the multiple die auto-thresholding (MDAT) algorithm in logic inspection. The embodiments described herein were created by the inventors to address the increasing demand for substantially large numbers of sensitivity regions and to improve the throughput of current logic region defect detection.

One embodiment relates to a system configured to detect defects in a logic region on a wafer. The system includes an inspection subsystem configured to scan a wafer to thereby generate output for the wafer. In one embodiment, the inspection subsystem is configured as an optical inspection subsystem. One embodiment of such a system is shown in FIG. 1. As shown in FIG. 1, the system includes inspection subsystem 100 and computer subsystem 102. This inspection subsystem is configured to scan wafer 110 by directing light to the wafer and detecting light from the wafer to thereby generate output for the wafer. For example, as shown in FIG. 1, the inspection subsystem includes light source 104, which may include any suitable light source known in the art.

Light from the light source is directed to beam splitter 106, which is configured to direct the light from the light source though lens 108 to wafer 110. The light source may be coupled to any other suitable elements (not shown) such as one or more condensing lenses, collimating lenses, relay lenses, objective lenses, apertures, spectral filters, polarizing components and the like. As shown in FIG. 1, the light may be directed to the wafer at a normal angle of incidence. However, the light may be directed to the wafer at any suitable angle of incidence including near normal and oblique incidence. In addition, the light or multiple light beams may be directed to the wafer at more than one angle of incidence sequentially or simultaneously. The inspection subsystem may be configured to scan the light over the wafer in any suitable manner.

Light reflected from wafer 110 may be collected and detected by one or more channels of the inspection subsystem during scanning. For example, light specularly reflected from wafer 110 may be collected by lens 108. Lens 108 may include a refractive optical element as shown in FIG. 1. In addition, lens 108 may include one or more refractive optical elements and/or one or more reflective optical elements. Light collected by lens 108 may be directed through beam splitter 106 to beam splitter 112, which may be configured to separate the light into two different paths, one of which is directed to detector 114 and another of which is directed to detector 116. The beam splitters shown in FIG. 1 may include any suitable beam splitters known in the art. The detectors shown in FIG. 1 may include any suitable detectors known in the art such as charge coupled devices (CCDs) or another type of imaging detector. Detectors 114 and 116 are configured to generate output that is responsive to the specularly reflected light. Therefore, each of the detectors form one channel of the inspection subsystem.

Since the inspection subsystem shown in FIG. 1 is configured to detect light specularly reflected from the wafer, the inspection subsystem is configured as a bright field (BF) inspection subsystem. Such an inspection subsystem may, however, also be configured for other types of wafer inspection. For example, the inspection subsystem may be configured for BF and another mode of inspection such as dark field (DF) inspection. In one such example, the inspection subsystem shown in FIG. 1 may also include one or more other channels (not shown). The other channel(s) may include any of the optical components described herein such as a lens and a detector, configured as a scattered light channel. The lens and the detector may be further configured as described herein. In this manner, the inspection subsystem may also be configured for DF inspection.

The inspection subsystem may be configured to generate the output for the wafer with one or more optics modes. In general, a "mode" is defined by the values of parameters of the inspection subsystem used for generating images of a wafer (or the output used to generate images of the wafer). Therefore, each optics mode is defined by different values for at least one parameter of the inspection subsystem (other than position on the wafer at which the output is generated). When generating output using multiple optics modes, the values of any optical parameter(s) of the inspection subsystem may be altered in any suitable manner if necessary. For example, to change the illumination polarization states for different optics modes, a polarizing component positioned in the path of the light from the light source may be removed and/or replaced with a different polarizing component. In another example, to change illumination angles for different optics modes, the position of the light source and/or any other optical components used to direct the light to the wafer may be altered in any suitable manner.

In some instances, depending on the configuration of the inspection subsystem, the two detectors shown in FIG. 1 may be configured to detect light having different characteristic(s) such as wavelength or polarization and the two detectors may be used to generate different output simultaneously in the same pass of an inspection process (i.e., during a single scan of the wafer). However, different output may be generated in different scans or passes of a single inspection process. For example, first output may be generated using a first optics mode in one pass or scan of the wafer, an optical parameter of the inspection subsystem may be altered as described above, and then second output may be generated using a second optics mode in a second pass or scan of the wafer. Furthermore, the inspection subsystem may be configured to generate output using two or more optics modes of the inspection subsystem.

Computer subsystem 102 is configured to acquire the output generated by the inspection subsystem. For example, the output generated by the detector(s) during scanning may be provided to computer subsystem 102. In particular, the computer subsystem may be coupled to each of the detectors (e.g., by one or more transmission media shown by the dashed lines in FIG. 1, which may include any suitable transmission media known in the art) such that the computer subsystem may receive the output generated by the detector(s). Computer subsystem 102 may be configured to perform a number of functions using the output of the detectors as described herein and any other functions described further herein. This computer subsystem may be further configured as described herein.

This computer subsystem (as well as other computer subsystems described herein) may also be referred to herein as computer system(s). Each of the computer subsystem(s) or system(s) described herein may take various forms, including a personal computer system, image computer, mainframe computer system, workstation, network appliance, Internet appliance, or other device. In general, the term "computer system" may be broadly defined to encompass any device having one or more processors, which executes instructions from a memory medium. The computer subsystem(s) or system(s) may also include any suitable processor known in the art such as a parallel processor. In addition, the computer subsystem(s) or system(s) may include a computer platform with high speed processing and software, either as a standalone or a networked tool.

It is noted that FIG. 1 is provided herein to generally illustrate one configuration of an optical inspection subsystem that may be included in the system embodiments described herein. Obviously, the optical inspection subsystem configuration described herein may be altered to optimize the performance of the inspection subsystem as is normally performed when designing a commercial inspection system. In addition, the systems described herein may be implemented using an existing inspection system (e.g., by adding functionality described herein to an existing inspection system) such as the 29xx and 39xx series of tools that are commercially available from KLA, Milpitas, Calif. For some such systems, the methods described herein may be provided as optional functionality of the system (e.g., in addition to other functionality of the system). Alternatively, the system described herein may be designed "from scratch" to provide a completely new system.

In another embodiment, the inspection subsystem is configured as an electron beam inspection subsystem. For example, the inspection subsystem may be configured to scan the wafer with electrons while detecting electrons from the wafer thereby generating output for the wafer. In one such embodiment shown in FIG. 2, the inspection subsystem includes electron column 122, which is coupled to computer subsystem 124.

Figure 2:
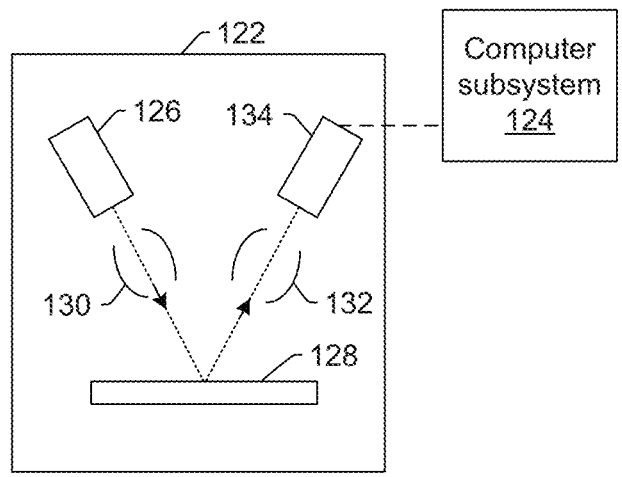

As also shown in FIG. 2, the electron column includes electron beam source 126 configured to generate electrons that are focused to wafer 128 by one or more elements 130. The electron beam source may include, for example, a cathode source or emitter tip, and one or more elements 130 may include, for example, a gun lens, an anode, a beam limiting aperture, a gate valve, a beam current selection aperture, an objective lens, and a scanning subsystem, all of which may include any such suitable elements known in the art.

Electrons returned from the wafer (e.g., secondary electrons) may be focused by one or more elements 132 to detector 134. One or more elements 132 may include, for example, a scanning subsystem, which may be the same scanning subsystem included in element(s) 130.

The electron column may include any other suitable elements known in the art. In addition, the electron column may be further configured as described in U.S. Pat. No. 8,664,594 issued Apr. 4, 2014 to Jiang et al., U.S. Pat. No. 8,692,204 issued Apr. 8, 2014 to Kojima et al., U.S. Pat. No. 8,698,093 issued Apr. 15, 2014 to Gubbens et al., and U.S. Pat. No. 8,716,662 issued May 6, 2014 to MacDonald et al., which are incorporated by reference as if fully set forth herein.

Although the electron column is shown in FIG. 2 as being configured such that the electrons are directed to the wafer at an oblique angle of incidence and are scattered from the wafer at another oblique angle, the electron beam may be directed to and scattered from the wafer at any suitable angles. In addition, the electron beam subsystem may be configured to use multiple modes to generate images of the wafer (e.g., with different illumination angles, collection angles, etc.). The multiple modes of the electron beam subsystem may be different in any image generation parameter(s) of the subsystem. For example, in an electron beam subsystem, different modes may use different angles of incidence for illumination.

Computer subsystem 124 may be coupled to detector 134 as described above. The detector may detect electrons returned from the surface of the wafer thereby forming electron beam images of the wafer. The electron beam images may include any suitable electron beam images. Computer subsystem 124 may be configured to perform any of the functions described herein using the output of the detector and/or the electron beam images. Computer subsystem 124 may be configured to perform any additional step(s) described herein. A system that includes the inspection subsystem shown in FIG. 2 may be further configured as described herein.

It is noted that FIG. 2 is provided herein to generally illustrate a configuration of an electron beam inspection subsystem that may be included in the embodiments described herein. As with the optical inspection subsystem described above, the electron beam subsystem configuration described herein may be altered to optimize the performance of the subsystem as is normally performed when designing a commercial inspection system. In addition, the systems described herein may be implemented using an existing inspection system (e.g., by adding functionality described herein to an existing inspection system) such as the eDR-xxxx series of tools that are commercially available from KLA. For some such systems, the embodiments described herein may be provided as optional functionality of the system (e.g., in addition to other functionality of the system). Alternatively, the system described herein may be designed "from scratch" to provide a completely new system.

Although the inspection subsystem is described above as being a light-based or electron beam-based subsystem, the inspection subsystem may be an ion beam-based subsystem. Such an inspection subsystem may be configured as shown in FIG. 2 except that the electron beam source may be replaced with any suitable ion beam source known in the art. In one embodiment, therefore, the inspection subsystem may be configured to scan the wafer by directing ions to the wafer. In addition, the inspection subsystem may be any other suitable ion beam-based subsystem such as those included in commercially available focused ion beam (FIB) systems, helium ion microscopy (HIM) systems, and secondary ion mass spectroscopy (SIMS) systems.

As noted above, the inspection subsystem is configured for scanning energy (e.g., light, electrons) over a physical version of the wafer thereby generating actual (i.e., not simulated) output and/or images for the physical version of the wafer. In this manner, the inspection subsystem is configured as an "actual" tool, rather than a "virtual" tool. Computer subsystem(s) 102 shown in FIG. 1 may, however, include one or more "virtual" systems (not shown) that are configured for performing one or more functions using at least some of the actual optical output or images and/or the actual electron beam output or images generated for the wafer, which may include any of the one or more functions described further herein.

The one or more virtual systems are not capable of having the wafer disposed therein. In particular, the virtual system(s) are not part of inspection subsystem 100 or electron column 122 and do not have any capability for handling the physical version of the wafer. In other words, in a virtual system, the output of its one or more "detectors" may be output that was previously generated by one or more detectors of an actual inspection subsystem and that is stored in the virtual system, and during the "scanning," the virtual system may replay the stored output as though the wafer is being scanned. In this manner, imaging and/or scanning the wafer with a virtual system may appear to be the same as though a physical wafer is being imaged and/or scanned with an actual system, while, in reality, the "scanning" involves simply replaying output for the wafer in the same manner as the wafer is scanned.

Systems and methods configured as "virtual" inspection systems are described in commonly assigned U.S. Pat. No. 8,126,255 issued on Feb. 28, 2012 to Bhaskar et al. and U.S. Pat. No. 9,222,895 issued on Dec. 29, 2015 to Duffy et al., both of which are incorporated by reference as if fully set forth herein. The embodiments and the one or more computer subsystems described herein may be further configured as described in these patents.

The computer subsystem is configured for acquiring information for design-based care areas in a logic region on the wafer. The design-based care areas include different types of design-based care areas and each of the design-based care areas is a discrete area within the logic region corresponding to a contiguous set of pixels in the output generated for the wafer. The computer subsystem may acquire the information for the design-based care areas from any method or system that generated the information and/or from a storage medium in which the information was stored by another method or system. Alternatively, the computer subsystem may acquire the information for the design-based care areas by generating the information. For example, the computer subsystem may be configured for processing design information for the wafer to generate the design-based care areas. In one such example, the computer subsystem may perform design-based care area (NPDCA) generation from design, as shown in step 300 of FIG. 3. The design information may include any design information or design data that is available for the wafer including graphical data stream (GDS) and other types of design data or design data proxies. The design information may have various formats but regardless of the design information type, the design data is created prior to the formation of any wafers that are printed with the design.

Different design-based care areas may be generated for different patterned features in the design for the wafer and that will be formed on the wafer. Therefore, different design-based care areas will correspond to different areas on the wafer (e.g., the areas on the wafer in which different patterned features are formed). In addition, since different areas on the wafer will correspond to different portions of the output (different pixels in the output), different design-based care areas will also correspond to different pixels in the output. In general, the design-based care areas will correspond to the discrete area of the patterned feature(s) for which they have been generated. As such, the discrete areas of the design-based care areas can have different shapes depending on the patterned features to which they correspond. For example, some of the design-based care areas may have irregular shapes and/or areas of different shapes and sizes. The pixels in the output that correspond to a design-based care area on the wafer may be identified in any suitable manner (e.g., by aligning the output generated by the detectors to the design information, which may be performed in any suitable manner known in the art).

The computer subsystem is also configured for designating the different types of the design-based care areas as different types of sub-regions. For example, different types of the design-based care areas may correspond to different types of patterned features on the wafer (e.g., a first type of design-based care area may correspond to a first type of patterned feature on the wafer, a second type of design-based care area may correspond to a second type of patterned feature on the wafer, and so on). Each of the different types of design-based care areas may then be designated as a different type of sub-region. In other words, a first type of design-based care area (e.g., design-based care area 0) may be designated as a first type of sub-region (e.g., sub-region0), a second type of design-based care area (e.g., design-based care area 1) may be designated as a second type of sub-region (e.g., sub-region1), and so on. The type of the design-based care area may be included in the information for the design-based care areas acquired by the computer subsystem.

For a localized area within the logic region, the computer subsystem is configured for assigning two or more instances of the sub-regions located in the localized area to a super-region. Although the embodiments may be described herein with respect to a super-region, the embodiments described herein may perform the same steps for more than one super-region in the logic region. The localized area in the logic region is smaller than the logic region. Therefore, there may be more than one localized area in a logic region. In this manner, the super-regions to which sub-regions are assigned by the embodiments described herein will include fewer than all of the instances of the sub-regions in the logic region. For example, each of the sub-regions may be assigned to any one super-region, and none of the super-regions may include all of the sub-regions in the logic region. The localized area may be defined as described further herein. The sub-regions that are located in a localized area may be determined in any suitable manner (e.g., based on wafer coordinates corresponding to the localized area and wafer coordinates corresponding to the sub-regions). If a sub-region spans more than one localized area (e.g., is partially located in a first localized area and is partially located in a second localized area), a merge or arbitration decision process may be performed to determine which localized area to assign the sub-region to, to determine if the sub-region should be sub-divided into sub-sub-regions, which are then included in different localized regions, etc.

The embodiments described herein therefore introduce the concept of sub/super-regions in logic defect detection. At setup time, the computer subsystem can assign neighboring logic design-based care areas (sub-regions) into the same super-region. A super-region therefore consists of many sub-regions. In one such example, as shown in step 302 of FIG. 3, the computer subsystem may assign neighboring sensitivity regions as sub-regions of the same super-region.

In one embodiment, the two or more instances of the sub-regions assigned to the super-region have different noise characteristics. For example, the sub-regions combined into a single super-region are from different types of design-based care areas and have different noise characteristics (i.e., produce different levels of noise in the output generated for the wafer by the inspection subsystem). Sub-regions are not necessarily related to each other except that they are located in the same larger localized area in the logic region. For example, sub-regions that are combined into one super-region may have the same noise characteristics but that is not a requirement of the embodiments described herein. In this manner, unlike combining care areas that have the same design and/or noise characteristics that is performed by some currently used inspection systems and methods, the embodiments described herein combine sub-regions into super-regions, not for noise or sensitivity reasons, but for throughput purposes.

In another embodiment, the two or more instances of the sub-regions assigned to the super-region are assigned different defect detection sensitivities used for detecting defects in the sub-regions. For example, since the different sub-regions assigned to a super-region may correspond to different types of design-based care areas and may have different noise characteristics, those sub-regions assigned to any one super-region may have been designated for inspection with different sensitivities. The different sensitivities of different sub-regions in a super-region may be handled by the embodiments described herein in the defect detection step. The different sensitivities of the different types of sub-regions may be determined and set during setup of the inspection recipe in any suitable manner known in the art.

In some embodiments, a number of the two or more instances of the sub-regions assigned to the super-region is fewer than 20. For example, in the embodiments described herein, the defect detection described herein may process all sub-regions from the same super-region (e.g., up to 16 sub-regions per super-region) in a single scatter plot. The exact number of sub-regions included in any one super-region may be quantified at the recipe setup time and possibly by a user.

In a further embodiment, the localized area within the logic region corresponds to a bounding box defined as a number of the pixels processed collectively in a defect detection algorithm used by the computer subsystem to perform the defect detection described herein. For example, the computer subsystem may merge currently used design-based care area regions that are relatively close by (e.g., belong to the same bounding box) into one super-region. The bounding box size may vary depending on the characteristics of the inspection subsystem (e.g., the width of a swath on the wafer that is scanned) and the characteristics of the computer subsystem (e.g., the processing capability of the computer subsystem) and may be determined at setup time of the logic region wafer inspection process.

In another embodiment, the localized area within the logic region corresponds to a frame defined as a number of the pixels processed collectively in a defect detection algorithm used by the computer subsystem to perform the defect detection described herein, and the two or more instances of the sub-regions that are assigned to the super-region include all of the instances of the sub-regions in the frame. For example, the computer subsystem may assign dynamically all sub-regions in a frame (1000×1000 pixel neighborhood for example or localized area) into the same super-region. Since the population of sub-regions within a frame varies, dynamically assigning the sub-regions has the advantage of higher throughput. In other words, super-regions that are generated for different frames may include different numbers of sub-regions. Such sub-regions may otherwise be assigned to the super-region for a frame as described further herein.

The computer subsystem may be configured for acquiring the output using the inspection subsystem. For example, as described further herein, acquiring the output may include scanning energy (e.g., light, electrons, ions, etc.) over the wafer and generating output responsive to energy (e.g., light, electrons, ions, etc.) from the wafer detected by the inspection subsystem during the scanning. In this manner, acquiring the output may include scanning the wafer. However, acquiring the output does not necessarily include scanning the wafer. For example, acquiring the output may include acquiring the output from a storage medium (not shown) in which the output has been stored (e.g., by the inspection subsystem). Acquiring the output from the storage medium may be performed in any suitable manner, and the storage medium from which the output is acquired may include any of the storage media described herein.

The computer subsystem is further configured for generating one scatter plot for all of the two or more instances of the sub-regions assigned to the super-region. For example, the computer subsystem may input test/reference frames and NPDCAs, as shown in step 304 of FIG. 3. The test/reference frames may then be used to generate the one scatter plot as described further herein. In addition, the computer subsystem is configured for generating the one scatter plot for only all of the two or more instances of the sub-regions assigned to the super-region. In other words, the one scatter plot generated for the super-region does not include any values for pixels that are not included in sub-regions assigned to the super-region. Although some steps are described herein with respect to one (or a single) scatter plot, the computer subsystem may generate different scatter plots for different super-regions, respectively (i.e., a first scatter plot for a first super-region, a second scatter plot for a second super-region, and so on). In this manner, one scatter plot may be generated for fewer than all of the sub-regions in the entire logic region, i.e., only those sub-regions in one super-region, and different scatter plots may be generated for different super-regions, respectively. In addition, values for all pixels located in all of the sub-regions assigned to any one super-region may be included in the scatter plot for that super-region. As such, the pixels in the sub-regions assigned to a super-region may be processed collectively to generate the scatter plot for the super-region.

The one scatter plot is generated with different segmentation values determined for the output corresponding to the different types of the sub-regions. "Segments" can be generally defined as different portions of an entire range of possible values for the pixels. For instance, in the MDAT algorithm, which is used by some wafer inspection systems commercially available from KLA, the value for the characteristic of the pixels that is used to define the segments (i.e., "segmentation values") may include median intensity value. In one such illustrative and non-limiting example, if the entire range of median intensity values is from 0 to 255, a first segment may include median intensity values from 0 to 100 and a second segment may include median intensity values from 101 to 255. In this manner, the first segment corresponds to darker areas in the output, and the second segment corresponds to brighter areas in the output. In the embodiments described herein, the segments may be defined along the y axis of the scatter plot. For example, different segments may correspond to different ranges of the median or dilated median values. Such segmentation groups the pixels in the same sub-regions together. The segmentation values may define two or more segments in the scatter plot, and the number of segments in the scatter plot may correspond to the number of different sub-regions located in the super-region for which the scatter plot is generated.

The embodiments described herein are therefore different from previously used methods and systems for logic region inspection because previously used methods and systems created one MDAT 2D scatter plot for each sensitivity region. Such methods and systems have therefore a number of disadvantages that the present embodiments do not. For example, design based care areas create overlapping and broken sensitivity regions and can require extra computation for any one pixel if it is in the immediate neighborhood of several sensitivity regions. In one such example, when applying a convolution kernel (filter) to the difference image, because the filter is sensitivity region based, a pixel could be processed several times when it is in the immediate neighborhood of several sensitivity regions. In addition, if memory (e.g., 8 MB of memory) is needed for each MDAT 2D scatter plot for each logic sensitivity region that means that the currently used computer subsystems (and their associated cache memories, e.g., L1 cache) cannot accommodate the substantially large numbers of logic sensitivity regions (e.g., about 256 regions to about 1000 regions) now generated for design-based care areas in logic regions. Previously used logic inspection methods and systems did not have to be configured to accommodate such large numbers of sensitivity regions because previously the maximum number of sensitivity regions was fewer than 10 (e.g., 4). In contrast, by organizing sensitivity regions into super-regions and sub-regions as described herein, the embodiments described herein enable better throughput and sensitivity in logic defect detection. In addition, the embodiments described herein provide better throughput and capability of handling substantially large numbers of sensitivity regions in logic defect detection.

Figure 4:
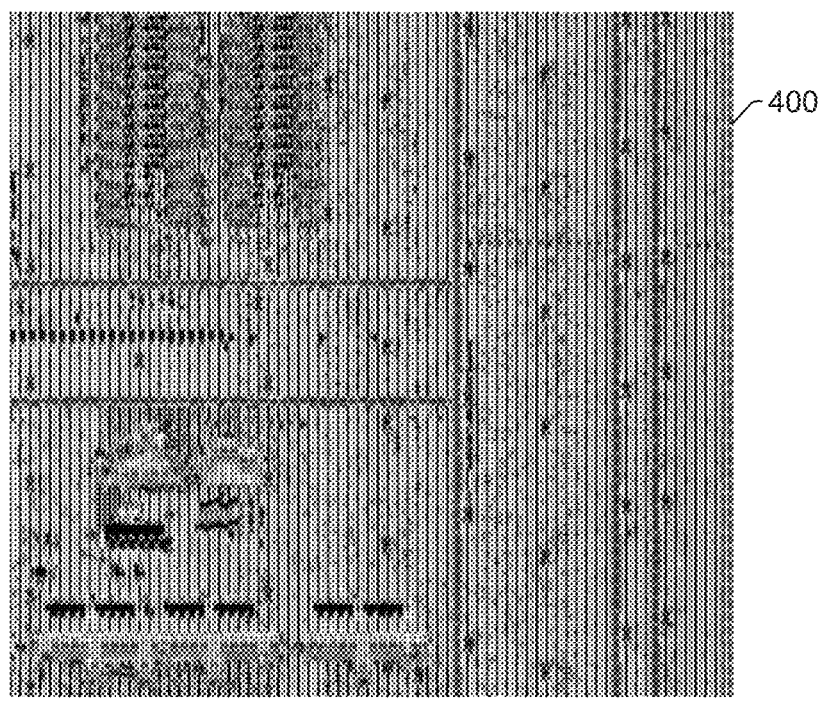
FIG. 4 is a plan view showing one example of a currently used care area in a logic region of a die and a scatter plot generated for the care area using a currently used defect detection method.
Figure 4:
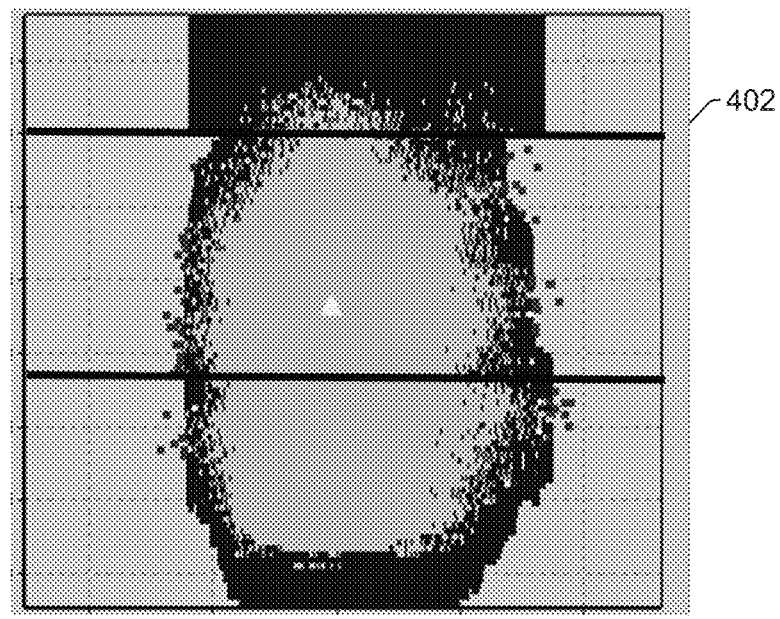
Figure 5:
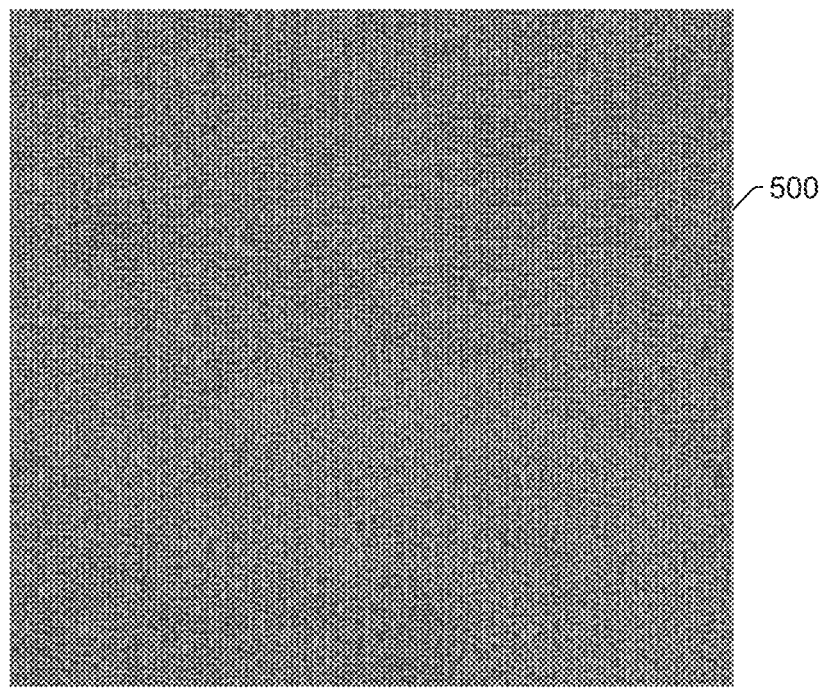
FIG. 5 is a plan view showing one example of currently used design based care areas in a logic region of a die and scatter plots generated for the design based care areas by a currently used defect detection method.
Figure 5:
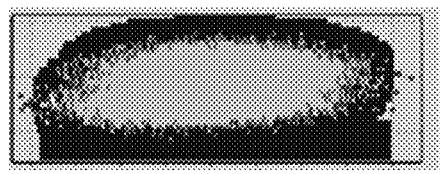
Figure 5:
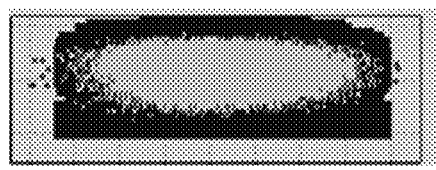
Figure 5:
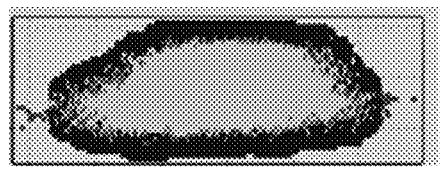
Figure 6:
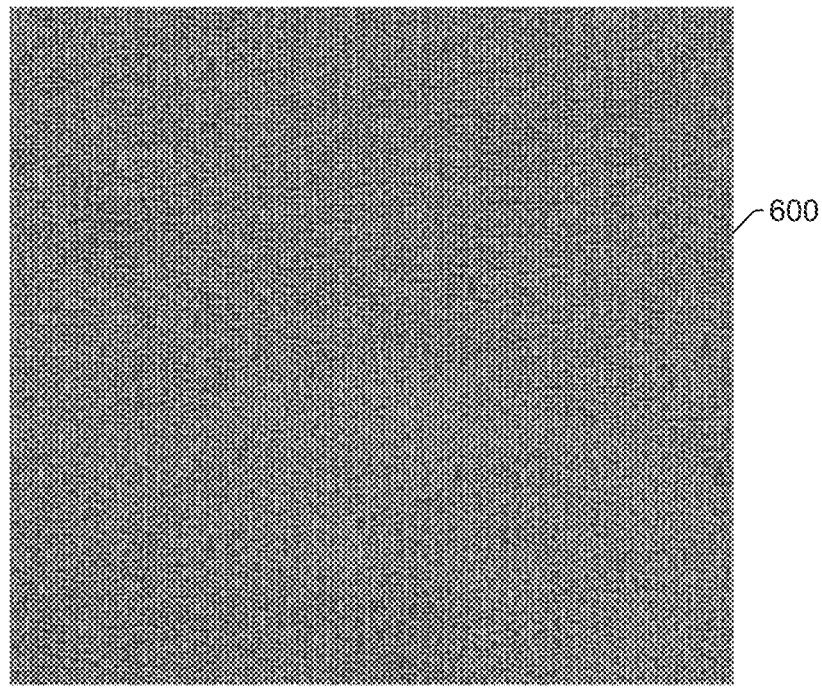
FIG. 6 is a plan view showing one example of currently used design based care areas in a logic region of a die and a scatter plot generated for the design based care areas according to the embodiments described herein.
Figure 6:
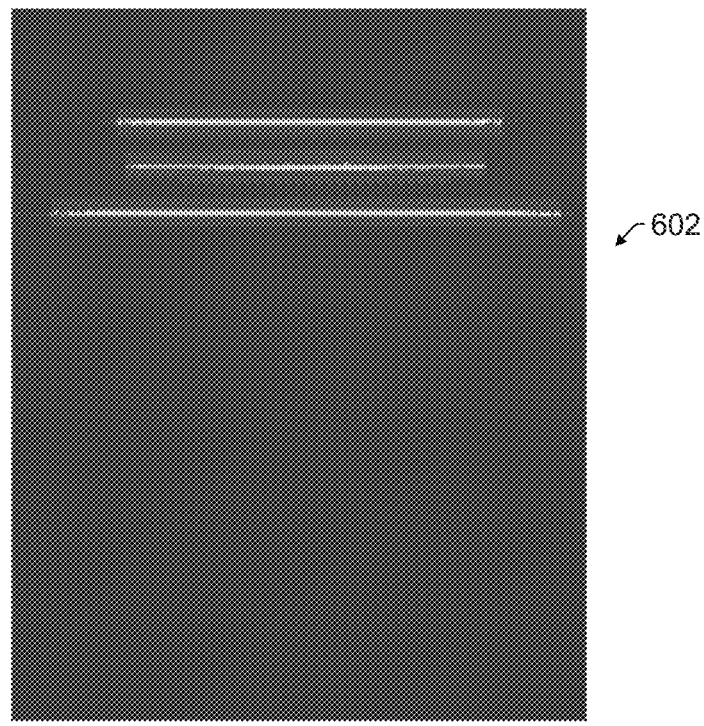

FIGS. 4-6 illustrate differences between the currently used logic inspection methods and systems and the present embodiments for scatter plots and scatter plot processing. For example, FIG. 4 includes one example of a sensitivity region used by current logic inspection methods and systems and a scatter plot that is generated for the sensitivity region by those methods and systems. In particular, scatter plot 402 may be generated for sensitivity region 400 by currently used methods and systems. As shown in sensitivity region 400, the currently used care areas may include different types of design features. In a scatter plot generated for such a sensitivity region, difference values for the pixels in the output generated for the sensitivity region may be plotted along the x-axis and the reference values for the pixels may be plotted along the y-axis. In scatter plot 402, the segment breaks (the dark horizontal lines across the scatter plot) separate different segments in the scatter plot. Different defect detection parameters of a defect detection method/algorithm may then be applied to the different segments. Pixels corresponding to outliers in the different segments can be identified as potential defects by the defect detection method/algorithm. Those outliers can then be further processed, e.g., by nuisance filtering, to determine which outliers correspond to defects on the wafer.

FIG. 5 in contrast shows a similar logic sensitivity region as that shown in FIG. 4 but separated into different design-based care areas (shown by different gray levels in sensitivity region 500) and scatter plots 502 generated for the different design-based care areas by currently used logic inspection methods and systems. In this manner, as shown by comparison of FIGS. 4 and 5, when using design-based care areas compared to traditional care areas, a similarly sized area may have a substantially greater number of different care areas. For example, a logic sensitivity region used to be a relatively large contiguous rectangle of pixels as shown in FIG. 4, but with the introduction of design-based care areas, the sensitivity region may be a broken sensitivity region, i.e., the previous, relatively large contiguous rectangle of pixels is broken up into different design-based care areas, as shown in FIG. 5.

Essentially, in this logic inspection set up, the segment breaks shown in scatter plot 402 are replaced by design-based care areas, with different scatter plots generated for different design-based care areas, respectively (i.e., a first scatter plot is generated for a first design-based care area, a second scatter plot is generated for a second design-based care area, and so on). In each of these scatter plots, difference values for the pixels in the output generated for the different instances of the same design-based care area may be plotted along the x-axis and the reference values for the pixels may be plotted along the y-axis. Since in the currently used logic inspection methods and systems, different scatter plots are generated for different types of design based care areas, the defect detection requires significantly more processing resources and time. Therefore, although such logic inspection methods and systems can provide better sensitivity, they have the disadvantages of being more costly, slower, and sometimes impractical. In contrast, the embodiments described herein provide more than 2× throughput improvement compared to currently used logic inspection methods and systems.

As shown in FIG. 6, in the present embodiments, sensitivity region 600 may include the same design-based care areas as sensitivity region 500. For example, the embodiments described herein may use the same design-based care areas as in currently used logic inspection methods and systems. In this example, the computer subsystem may assign all of the instances of the design-based care areas in sensitivity region 600 as different sub-regions, and all of the instances of the sub-regions shown in sensitivity 600 region may be combined into one super-region. Therefore, a super-region created for sensitivity region 600 may include different types of design-based care areas that generate different noise levels in the output generated by the inspection subsystem.

In contrast to the scatter plots shown in FIG. 5, however, in the present embodiments, one scatter plot 602 is generated for all of the sub-regions that are included in the super-region generated for sensitivity region 600. As shown in FIG. 6, scatter plot 602 has 3 distinct subsets of values for the pixels in the sensitivity region, each of which corresponds to a different type of sub-region in the sensitivity region. The different subsets of values therefore correspond to different, discrete "MDAT clouds" in the same scatter plot. Different segmentation values may be determined then for each of the different subsets of values. In other words, each sub-region has its own range of segmentation values on the super-region scatter plot. For example, sub-region0 may have segmentation values of 0-15 on the scatter plot, sub-region1 may have segmentation values of 16-31 on the scatter plot, and so on and so forth. Once an outlier is detected by performing defect detection using the scatter plot as described further herein, the sub-region ID from the segmentation range of the scatter plot can be looked up to determine where the outlier is coming from.

In some embodiments, the computer subsystem is configured for applying the same pre-processing to all of the output corresponding to the sub-regions assigned to the super-region, and the pre-processing includes all output processing functions performed on the output between output generation and scatter plot generation. For example, during (and possibly after) a detection scan of a wafer, the computer subsystem may apply the same pre-processing for all sub-regions in the super-region. The pre-processing that is performed by the computer subsystem between output generation and scatter plot generation may include a broad range of pre-processing techniques such as, but not limited to, convolution, Fast Fourier Transform (FFT) processing, de-noising, histogram modification, morphologic operations, and the like.

In one embodiment, the one scatter plot is a two-dimensional (2D) scatter plot. In another embodiment, the computer subsystem is configured for determining difference values and other values for the pixels in the output corresponding to the sub-regions assigned to the super-region and generating the one scatter plot from the determined difference values and other values. For example, as shown in FIG. 6, one 2D scatter plot 602 may be generated for one super-region in the logic region. The 2D scatter plot may be generated from the difference values and the other values for the pixels in the output corresponding to substantially the same locations in the sub-regions assigned to the super-region. For example, the other values (e.g., some type of median values) for the pixels in the output may be plotted along the y-axis, and the difference values for the pixels in the output may be plotted along the x-axis. The 2D scatter plot may be generated using any suitable method and/or algorithm. Although a 2D scatter plot may be the most commonly used by the embodiments described herein, the scatter plot may be generated with other dimensions (e.g., one dimension if the number of pixels in the images is relatively small and the MDAT algorithm starts ignoring the segmentation axis (y-axis) or more than two dimensions if the scatter plot is generated using more than two values determined for the pixels).

In one such embodiment, determining the difference values for the pixels includes subtracting a reference characteristic from a characteristic of the pixels. The characteristic of the pixels that is used in the subtracting may include intensity or gray level intensity or any other suitable characteristic. The reference characteristic may include a characteristic of each of the pixels in the output generated for the wafer by the inspection subsystem for a reference die on the wafer that is subtracted from the characteristic of its corresponding pixel in the output for a test die on the wafer. The test die and the reference die may include any two dies on the wafer such as two dies that are adjacent to each other on the wafer. In this manner, the difference values may be determined in a die-to-die type comparison or subtraction. However, any other reference die known in the art may be used in the embodiments described herein. In addition, the reference characteristic may include a characteristic corresponding to each of the pixels in the output for a test die on the wafer that is obtained from a reference database for the wafer. In this manner, the difference values may be determined in a die-to-database type comparison or subtraction.

In some embodiments, the difference values are values for a linearly filtered difference, a match filtered difference, a non-linear filtered difference, a normalized difference, or a square root of a product of two differences. These difference values may be determined in any suitable manner using any suitable method and/or algorithm. The pixels in the output for which the difference values are determined may include all of the pixels in the output or only some of the pixels in the output. For example, if the inspection is to be performed in only a portion of the logic region on the wafer, then the difference values may be determined for only the pixels corresponding to the portion of the logic region.

In some such embodiments, determining the other values for the pixels includes determining a value of another characteristic of each of the pixels. Determining the other values may include determining a value of another characteristic of each of the pixels in the output for the reference die and the other characteristic of its corresponding pixel in the output for the test die. In another such embodiment, the other values are values for a median, a dilated median, or a range of median values. For example, the other values may include values for a median between corresponding pixels in the output. However, the other values may be values for a dilated median or a range of median values between corresponding pixels in the output. These other values may be determined using any suitable method and/or algorithm. The pixels in the output for which the other values are determined may correspond to the pixels for which the difference values are determined.

The scatter plot analysis described further herein may be extended by using the dilated median instead of the median in the y-axis of the scatter plot. The median frame can be quieter and can misrepresent pixels near wafer patterns. Utilizing dilated median may better arbitrate pixels surrounded with different patterns. Although a variety of other values may be used in the y-axis or the segmentation axis of the scatter plot, median, dilated median, and range of median are ways of segmentation (or arbitration) of pixels that provide better separation between defects of interest (DOIs) and nuisance.

The characteristic of the pixels that is used for determining the other values may include intensity, gray level intensity, or any other suitable characteristic. In one embodiment, the characteristic and the other characteristic are intensity of the pixels in the output. Therefore, the characteristics used to determine the difference and other values may be the same characteristic, and the pixels in the output will most likely have different values for that characteristic.

The computer subsystem is also configured for detecting defects in the sub-regions based on the one scatter plot. In this manner, a defect detection algorithm and/or method including those described further herein can be used to process all (multiple) sub-regions from the same super-region in a single scatter plot for logic inspection. For example, the computer subsystem may process all sub-regions from the same super-region in the same MDAT scatter plot, as shown in step 306 of FIG. 3. Detecting the defects may be performed as described further herein.

In one embodiment, detecting the defects includes identifying outliers in the one scatter plot and determining if the outliers correspond to defects. Determining if the outliers correspond to defects may be performed in any suitable manner. In some embodiments, determining if the outliers correspond to defects or DOIs may include some kind of filtering based on one or more characteristics of the identified outliers. Such filtering may include nuisance or noise filtering or another kind of detected event analysis.

In another embodiment, detecting the defects includes separating the scatter plot into two or more segments based on the different segmentation values and separately performing the detecting in each of the two or more segments. For example, as described above, different segmentation values may be determined for different types of the sub-regions. Therefore, different segments in the scatter plot will correspond to different sub-regions. The defect detection may then be performed separately for the pixels in the different segments and therefore different sub-regions. Performing the defect detection separately in the different segments (and sub-regions) advantageously allows the defect detection to be performed with different parameters in the sub-regions. In this manner, the defect detection that is performed in the different sub-regions can be tailored to the patterned features in the sub-regions and the noise characteristics of the sub-regions.

In one such embodiment, one or more first defect detection parameters used for the detecting in a first of the two or more segments are different than one or more second defect detection parameters used for detecting the defects in a second of the two or more segments. The defect detection parameters used for different segments may be different in the defect detection algorithms that are assigned to the different segments. Alternatively, the defect detection parameters used for different segments may be different in one or more parameters of the same defect detection algorithm.

In another such embodiment, the one scatter plot is generated from difference values and other values for the pixels in the output corresponding to the sub-regions assigned to the super-region, and the one or more first and second defect detection parameters include different thresholds that are applied to the difference values for the pixels in the output. For example, although different types of sub-regions included in a single super-region may be processed collectively in the same single scatter plot, they can be inspected with different sensitivities. Therefore, different portions of the 2D scatter plot corresponding to the different sub-regions may be inspected with different sensitivities. In the embodiments described herein, with the introduction of sub-regions, pixels can be inspected with different sensitivities because they are separated in the scatter plot not only by background intensity but also by sub-region. The defect detection algorithms that are assigned to the different segments or one or more parameters of which are assigned to the different segments may include any suitable defect detection algorithms and any parameters of those algorithms. For example, the defect detection algorithm may be a segmented auto-thresholding (SAT) algorithm or an MDAT algorithm. The defect detection parameters and algorithm that are applied to each of the sub-regions may be determined in any suitable manner. For example, the defect detection parameters and algorithm may be determined such that more critical areas are inspected with higher sensitivity than less critical areas and such that more noisy areas are inspected with lower sensitivity than more quiet areas.

In another embodiment, the one scatter plot is generated from difference values and other values for the pixels in the output corresponding to the sub-regions assigned to the super-region, and the computer subsystem is configured for applying the same filter to the difference values for all of the pixels in the output corresponding to the sub-regions assigned to the super-region. For example, currently used logic inspection methods and systems have widely adopted difference filters (or "diff filter"), which is a filter (e.g., a convolution filter) that is applied to results of subtracting a reference from a test output (e.g., test image minus reference image thereby creating a difference image). In previously used logic inspection systems and methods, the diff filter is repeatedly applied on the same pixels from close by NPDCAs (e.g., neighboring NPDCAs). However, in the embodiments described herein, since nearby and/or neighboring NPDCAs are processed collectively, the embodiments require less processing resources for the diff filter. In one such example, the computer subsystem may apply the same diff filter for all sub-regions in the same super-region.

In an additional embodiment, the computer subsystem is configured for applying the same post-processing for all of the output corresponding to the sub-regions assigned to the super-region, and the post-processing includes all functions performed for the output between detecting the defects and generating results for the detected defects. For example, similar to processing all of the sub-regions assigned to a super-region collectively for defect detection pre-processing, all sub-regions from the same super-region can be processed collectively for merge/arbitration (combining neighboring defective pixels to the same defect and assigning attributes/features to the defects), defect attribute and feature calculations, nuisance event filtering (NEF)/defect binning (e.g., using a product such as iDO that is commercially available from KLA) with patch extraction and results extraction. In one such example, the computer subsystem may be configured for merge/arbitration, defect attribute/feature calculation, and defect patch extraction, as shown in step 308 of FIG. 3. In addition, the computer subsystem may be configured for NEF/iDO to filter out nuisances, as shown in step 310 of FIG. 3.

Figure 3:
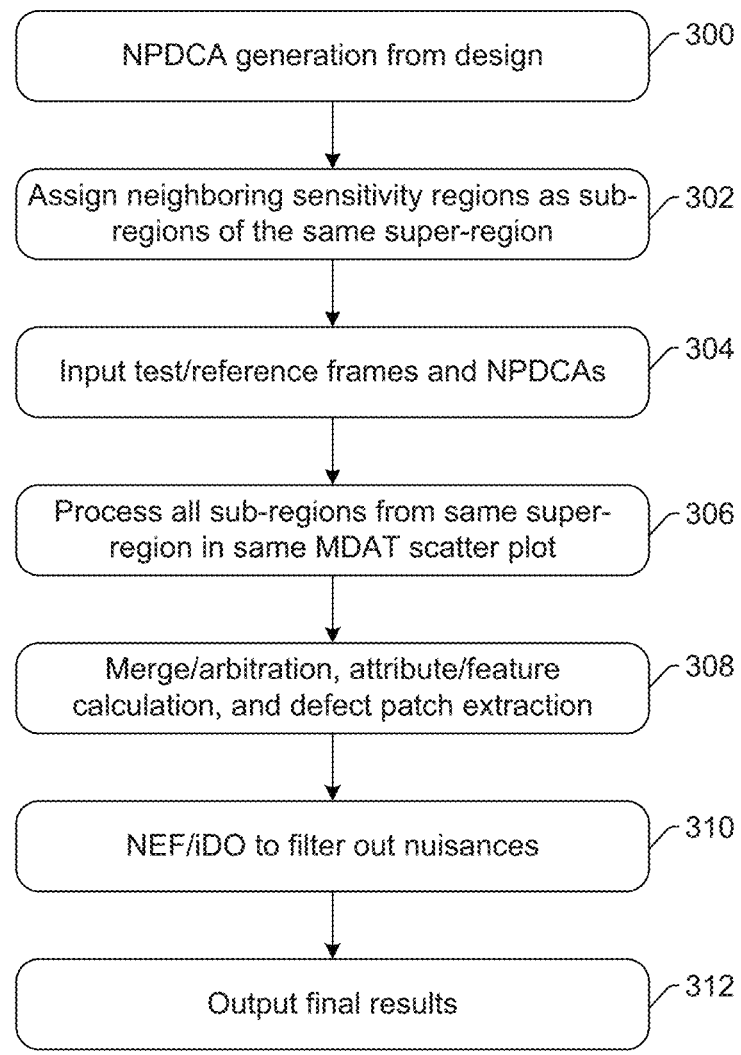
FIG. 3 is a flow chart illustrating one embodiment of steps that may be performed by embodiments described herein for detecting defects in a logic region on a wafer.

The computer subsystem may be further configured for outputting the final results of the logic inspection, as shown in step 312 of FIG. 3. The results of the inspection produced by the computer subsystem may include the sub-region/super-region ID corresponding to any detected defects and/or outliers as a defect attribute/feature, which may be useful when determining information about the wafer/wafer fabrication process from the inspection results. The inspection results may also include any other information generated for the defects, logic region, or wafer by the embodiments described herein. The inspection results may have any suitable format and may be stored in any suitable storage medium. The results can then be used to make changes to the wafer and/or wafer fabrication process, which may be performed by the embodiments described herein or another method or system.

Each of the embodiments of each of the systems described above may be combined together into one single embodiment.

Another embodiment relates to a computer-implemented method for detecting defects in a logic region on a wafer. The computer-implemented method includes acquiring information for design-based care areas in a logic region of a wafer. The design-based care areas include different types of design-based care areas and each of the design-based care areas is a discrete area within the logic region corresponding to a contiguous set of pixels in output generated for the wafer by an inspection subsystem configured to scan the wafer to thereby generate the output. The method also includes designating the different types of the design-based care areas as different types of sub-regions. For a localized area within the logic region, the method includes assigning two or more instances of the sub-regions located in the localized area to a super-region. In addition, the method includes generating one scatter plot for all of the two or more instances of the sub-regions assigned to the super-region. The one scatter plot is generated with different segmentation values determined for the output corresponding to the different types of the sub-regions. The method further includes detecting defects in the sub-regions based on the one scatter plot.

Each of the steps of the method may be performed as described further herein. The method may also include any other step(s) that can be performed by the inspection subsystem and/or computer subsystem(s) or system(s) described herein. The steps described above are performed by one or more computer systems, which may be configured according to any of the embodiments described herein. In addition, the method described above may be performed by any of the system embodiments described herein.

All of the methods described herein may include storing results of one or more steps of the method embodiments in a computer-readable storage medium. The results may include any of the results described herein and may be stored in any manner known in the art. The storage medium may include any storage medium described herein or any other suitable storage medium known in the art. After the results have been stored, the results can be accessed in the storage medium and used by any of the method or system embodiments described herein, formatted for display to a user, used by another software module, method, or system, etc.

Figure 7:
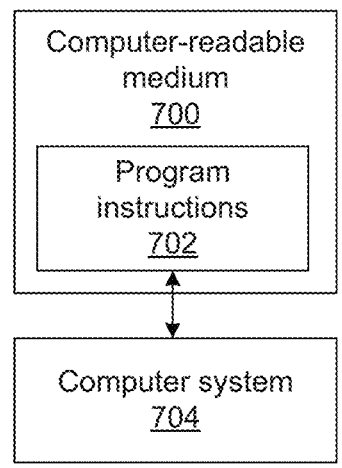
FIG. 7 is a block diagram illustrating one embodiment of a non-transitory computer-readable medium storing program instructions executable on a computer system for performing one or more of the computer-implemented method embodiments described herein.

An additional embodiment relates to a non-transitory computer-readable medium storing program instructions executable on a computer system for performing a computer-implemented method for detecting defects in a logic region on a wafer. One such embodiment is shown in FIG. 7. In particular, as shown in FIG. 7, non-transitory computer-readable medium 700 includes program instructions 702 executable on computer system 704. The computer-implemented method may include any step(s) of any method(s) described herein.

Program instructions 702 implementing methods such as those described herein may be stored on computer-readable medium 700. The computer-readable medium may be a storage medium such as a magnetic or optical disk, a magnetic tape, or any other suitable non-transitory computer-readable medium known in the art.

The program instructions may be implemented in any of various ways, including procedure-based techniques, component-based techniques, and/or object-oriented techniques, among others. For example, the program instructions may be implemented using ActiveX controls, C++ objects, JavaBeans, Microsoft Foundation Classes ("MFC"), SSE (Streaming SIMD Extension) or other technologies or methodologies, as desired.

Computer system 704 may be configured according to any of the embodiments described herein.

Further modifications and alternative embodiments of various aspects of the invention will be apparent to those skilled in the art in view of this description. For example, methods and systems for detecting defects in a logic region on a wafer are provided. Accordingly, this description is to be construed as illustrative only and is for the purpose of teaching those skilled in the art the general manner of carrying out the invention. It is to be understood that the forms of the invention shown and described herein are to be taken as the presently preferred embodiments. Elements and materials may be substituted for those illustrated and described herein, parts and processes may be reversed, and certain features of the invention may be utilized independently, all as would be apparent to one skilled in the art after having the benefit of this description of the invention. Changes may be made in the elements described herein without departing from the spirit and scope of the invention as described in the following claims.

What is claimed is:

1. A system configured to detect defects in a logic region on a wafer, comprising:
    an inspection subsystem configured to scan a wafer to thereby generate output for the wafer; and
    a computer subsystem configured for:
        acquiring information for design-based care areas in a logic region of the wafer, wherein the design-based care areas comprise different types of design-based care areas and each of the design-based care areas is a discrete area within the logic region corresponding to a contiguous set of pixels in the output generated for the wafer;
        designating the different types of the design-based care areas as different types of sub-regions;
        for a localized area within the logic region, assigning two or more instances of the sub-regions located in the localized area to a super-region;
        generating one scatter plot for all of the two or more instances of the sub-regions assigned to the super-region, wherein the one scatter plot is generated with different segmentation values determined for the output corresponding to the different types of the sub-regions; and
        detecting defects in the sub-regions based on the one scatter plot wherein the localized area within the logic region corresponds to a frame defined as a number of pixels processed collectively in a defect detection algorithm used by the computer subsystem to perform said detecting, and wherein the two or more instances of the sub-regions assigned to the super-region comprise all of the instances of the sub-regions in the frame.

2. The system of claim 1, wherein the two or more instances of the sub-regions assigned to the super-region have different noise characteristics.

3. The system of claim 1, wherein the two or more instances of the sub-regions assigned to the super-region are assigned different defect detection sensitivities used for said detecting.

4. The system of claim 1, wherein the one scatter plot is a two-dimensional scatter plot.

5. The system of claim 1, wherein the computer subsystem is further configured for determining difference values and other values for the pixels in the output corresponding to the sub-regions assigned to the super-region and generating the one scatter plot from the determined difference values and other values.

6. The system of claim 5, wherein determining the difference values for the pixels comprises subtracting a reference characteristic from a characteristic of the pixels.

7. The system of claim 6, wherein determining the other values for the pixels comprises determining a value of another characteristic of each of the pixels.

8. The system of claim 5, wherein the other values are values for a median, a dilated median, or a range of median values.

9. The system of claim 1, wherein said detecting comprises identifying outliers in the one scatter plot and determining if the outliers correspond to defects.

10. The system of claim 1, wherein said detecting comprises separating the scatter plot into two or more segments based on the different segmentation values and separately performing said detecting in each of the two or more segments.

11. The system of claim 10, wherein one or more first defect detection parameters used for said detecting in a first of the two or more segments are different than one or more second defect detection parameters used for said detecting in a second of the two or more segments.

12. The system of claim 11, wherein the one scatter plot is generated from difference values and other values for the pixels in the output corresponding to the sub-regions assigned to the super-region, and wherein the one or more first and second defect detection parameters comprise different thresholds that are applied to the difference values for the pixels in the output.

13. The system of claim 1, wherein a number of the two or more instances of the sub-regions assigned to the super-region is fewer than 20.

14. The system of claim 1, wherein the localized area within the logic region further corresponds to a bounding box defined as a number of the pixels processed collectively in a defect detection algorithm used by the computer subsystem to perform said detecting.

15. The system of claim 1, wherein the computer subsystem is further configured for applying the same pre-processing to all of the output corresponding to the sub-regions assigned to the super-region, and wherein the pre-processing comprises all output processing functions performed on the output between output generation and scatter plot generation.

16. The system of claim 1, wherein the one scatter plot is generated from difference values and other values for the pixels in the output corresponding to the sub-regions assigned to the super-region, and wherein the computer subsystem is further configured for applying the same filter to the difference values for all of the pixels in the output corresponding to the sub-regions assigned to the super-region.

17. The system of claim 1, wherein the computer subsystem is further configured for applying the same post-processing for all of the output corresponding to the sub-regions assigned to the super-region, and wherein the post-processing comprises all functions performed for the output between said detecting and generating results for the detected defects.

18. The system of claim 1, wherein the inspection subsystem is further configured as an optical inspection subsystem.

19. The system of claim 1, wherein the inspection subsystem is further configured as an electron beam inspection subsystem.

20. A non-transitory computer-readable medium, storing program instructions executable on a computer system for performing a computer-implemented method for detecting defects in a logic region on a wafer, wherein the computer-implemented method comprises:

acquiring information for design-based care areas in a logic region of a wafer, wherein the design-based care areas comprise different types of design-based care areas and each of the design-based care areas is a discrete area within the logic region corresponding to a contiguous set of pixels in output generated for the wafer by an inspection subsystem configured to scan the wafer to thereby generate the output;

designating the different types of the design-based care areas as different types of sub-regions;

for a localized area within the logic region, assigning two or more instances of the sub-regions located in the localized area to a super-region;

generating one scatter plot for all of the two or more instances of the sub-regions assigned to the super-region, wherein the one scatter plot is generated with different segmentation values determined for the output corresponding to the different types of the sub-regions; and detecting defects in the sub-regions based on the one scatter plot wherein the localized area within the logic region corresponds to a frame defined as a number of pixels processed collectively in a defect detection algorithm used by the computer system to perform said detecting, and wherein the two or more instances of the sub-regions assigned to the super-region comprise all of the instances of the sub-regions in the frame.

21. A computer-implemented method for detecting defects in a logic region on a wafer, comprising:

acquiring information for design-based care areas in a logic region of a wafer, wherein the design-based care areas comprise different types of design-based care areas and each of the design-based care areas is a discrete area within the logic region corresponding to a contiguous set of pixels in output generated for the wafer by an inspection subsystem configured to scan the wafer to thereby generate the output;

designating the different types of the design-based care areas as different types of sub-regions;

for a localized area within the logic region, assigning two or more instances of the sub-regions located in the localized area to a super-region;

generating one scatter plot for all of the two or more instances of the sub-regions assigned to the super-region, wherein the one scatter plot is generated with different segmentation values determined for the output corresponding to the different types of the sub-regions; and detecting defects in the sub-regions based on the one scatter plot wherein the localized area within the logic region corresponds to a frame defined as a number of pixels processed collectively in a defect detection algorithm used by a computer subsystem to perform said detecting and wherein the two or more instances of the sub-regions assigned to the super-region comprise all of the instances of the sub-regions in the frame.

* * * * *